United States Patent [19]
Matsuda

[11] 3,734,632
[45] May 22, 1973

[54] CURRENT COMPENSATED DETECTION CIRCUITS FOR PHOTOVOLTAIC CELLS

[75] Inventor: Motonobu Matsuda, Sakai, Japan

[73] Assignee: Minolta Camera Kabushiki Kaisha, Osaka-shi, Osaka-fu, Japan

[22] Filed: Oct. 29, 1971

[21] Appl. No.: 193,817

[30] Foreign Application Priority Data

Oct. 31, 1970 Japan ................................45/96209
Aug. 12, 1971 Japan ................................46/60604

[52] U.S. Cl. ..................................356/226, 250/213
[51] Int. Cl. ..............................................G01j 1/44
[58] Field of Search ......................356/226; 250/212, 250/214

[56] References Cited

UNITED STATES PATENTS 3,424,908 1/1969 Sittes..................................250/212

*Primary Examiner*—Ronald L. Wibert
*Assistant Examiner*—Conrad Clark
*Attorney*—Watson, Cole, Grindle & Watson

[57] ABSTRACT

A circuit for detecting current generated by a light transducer such as a photovoltaic cell includes at least one P-N junction for biasing a transistor to compensate for the voltage drop of the base emitter junction thereof and includes feedback between the collector of the transistor and the biasing junction to compensate for temperature changes and changes in the amplification factor of the transistor whereby the linearity of the light transducer output is maintained.

9 Claims, 3 Drawing Figures

CURRENT COMPENSATED DETECTION CIRCUITS FOR PHOTOVOLTAIC CELLS

BACKGROUND OF THE INVENTION

The present invention relates to a means for detecting the generated current of a photovoltaic cell corresponding to received light intensity.

It is known that the generated current i of a photovoltaic cell is $$i = i_l - i_o\ (1 - e^{qv/kT})\ \text{wherein}$$

$i_l$ is the generated current of the photoooltaic, which current $i_l$ is proportional to the received light intensity of, but the current $i_o$ does not depend upon the received light intensity. And, circuit $i_o$ varies in proportion to $e^{qv/kT}$ wherein k is a constant, T is the absolute temperature, $q$ is Boltzman's constant and V is the voltage across the photovoltaci cell. Thus, if the absolute temperature T is fixed, $e^{qv/kT}$ depends only upon the voltage across the photovoltaic cell. That is, current $i_o$ of the above formula depends upon the voltage across the photovoltaic cell.

Therefore, in order to make the current generated by a photovoltaic cell proportional to its received light intensity, it is necessary to detect the current $i_l$ and reduce the current $i_o$ to zero. Thus, it is necessary that the voltage V across the photovoltaic cell should be kept at zero potential. If there is a change in the received light intensity that causes a change in the generated current $i_l$, the output voltage and the voltage across a photovoltaic cell also change and therefore the voltage V across a photovoltaic cell is not constant. Thus, it is difficult across a phtoltaic cell constantly at zero.

On the contrary, even is a change is caused in the generated current of photovoltaic cell, many attempts have been made to add an automatic compensating circuit for maintaining the voltage across the photovoltaic cell at zero constantly. However, the formation of the automatic compensating circuit has become more and more complicated; besides, relative to great changes brought about in the received light intensity of a photovoltaic cell, it has been impossible to keep the voltage across the photovoltaci cell at zero voltage constantly and correctly.

OBJECT OF THE INVENTION

One object of the present invention is to provide a means of keeping the voltage across the photovoltaic cell at zero voltage constantly, without reference to the output voltage reverting from the received light.

Another object of the present invention is to provide means for detecting the amplification output of high current proportional to the received light intensity that is gained by keeping the voltage across a photovoltaic cell at zero voltage constantly without reference to the received light intensity.

Still another object of the present invention is to provide means for keeping the voltage across a photovoltaic cell at zero voltage constantly without reference to the received light intensity and compensating for errors made by temperature conditions or the amplification multiplying factor of a transistor.

SUMMARY OF THE INVENTION

The present invention, relates to a detecting means connecting a photovoltaic cell to the base or emitter of a first transistor; generating feed back current proportional to its collector current from a feedback circuit; feeding the feedback current to a second P-N junction such as a transistor or a diode having the same characteristic as the first transistor; employing a circuit for equalizing the voltage drop caused in the second P-N junction and for biasing the first transistor and keeping the voltage across the photovoltaic cell at zero voltage and detecting the generated current proportional to the received light intensity of the photovoltaic cell by means of an ammeter connected to the circuit.

The results of the present invention are obtained by selecting the second transistor or diode to have a characteristic which is equal to that of the first transistor with current proportional to the collector current of the first transistor, and by equalizing the voltage drop of the second P-N junction as the bias voltage of the first transistor, while keeping the voltage across the photovoltaic cell at zero voltage constantly, thereby making the generated current of the photovoltaic cell proportional to the received light intensity of the cell.

Moreover, the present invention, by connecting the photovoltaic cell to the base of the first transistor, can detect a current proportional to the received light intensity of the photovoltaic cell by means of the amplification of the first transistor.

In addition, the present invention makes it possible to correct sufficiently errors caused by temperature changes by connecting the photovoltaic cell to the emitter of the first transistor, correct errors caused by changes of the proportional constant of an output current resulting from the amount of the input current of the transistor, and detect correctly the value of the generated current proportional to the received light intensity of the photovoltaic cell.

DESCRIPTION OF THE PREFERRED EMBODIMENT

Figure 1:
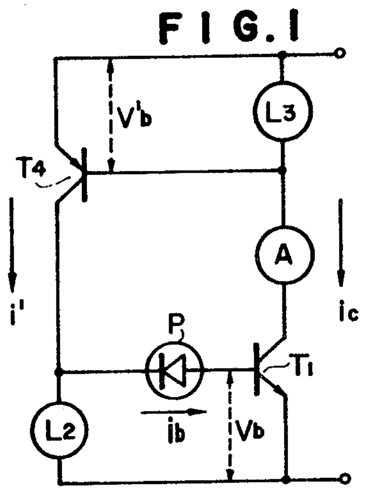
FIG. 1 is a circuit diagram illustrating, the operating principle of the structure of the present invention.

In FIG. 1 photovoltaic cell P is connected to the base of transistor $T_1$ for amplifying the generated current $i_b$ of the cell. The above generated current $i_b$ is the base current of transistor $T_1$. Therefore, if the current amplification factor of transistor $T_1$ is $\beta$, the collector current $i_c$ is $$i_c = \beta\, i_b$$

and the voltage $V_b$ between the base and emitter of transistor $T_1$ is $$i_b = (C_1/\beta)\ e^{rVb}$$

therefore, if a current $i'$ proportional to the collector circuit $i_c$ is provided to P-N junction $L_2$ having the same functional characteristic as that of transistor $T_1$, The voltage drop of P-N junction $L_2$ and the above voltage $V_b$ are made equal, and if both terminals of P-N junction $L_2$ are connected to the anode of the photovoltaic cell P and the emitter of the first transistor $T_1$, formulas apply $$i' = C_2 e^{rV_b} \text{ and}$$

$$i'/i_b = \beta\ (C_2/C_1)$$

Therefore, in the formulas $i_b = i_c/\beta$ and $i'/i_c = C_2/C_1$, if $i'$ is caused to undergo changes proportional to $i_c$, the voltage across photovoltaic cell P can be kept at zero voltage.

As described above, a feedback circuit is provided for generating current $i'$ running through second P-N junction $L_2$ proportional to the collector current $i_c$ of transistor $T_1$ P-N junction $L_3$ is connected in series via ammeter A to the collector of transistor $T_1$, and the circuit is equipped with another transistor $T_4$ having the same functional characteristic as that of P-N junction $L_3$. The base and the emitter of transistor $T_4$ are connected across P-N junction $L_3$, and the collector of transistor $T_4$ is connected to the cathode of photovoltaic element P and second P-N junction $L_2$.

Thus, by employing a feedback circuit the collector current $i_c$ of transistor $T_1$ flows through P-N junction $L_3$ and the base current of transistor $T_4$ is controlled by the voltage across P-N junctions $L_3$. That is, $$i_c = C_3 e^{rV_{b'}}$$

Therefore, if the collector current of transistor $T_4$ is $i''$, $$i'' = C_4 e^{rV_{b'}}$$

To set up the formula $i' = i''$ $$i_c/i'' = C_3/C_4$$

and $i_c = (C_1/C_2)\ i'$

Thus, $$'' = i_c\ (C_4C/_3) = (C_4/C_3) \cdot (C_1/C_2)\ i'$$

Therefore, $$(C_4/C_3) \cdot (C_1/C_2) = 1$$

may be set up by selecting transistors $T_1$ and $T_4$ and P-N junction $L_2$ and $L_3$.

Figure 2:
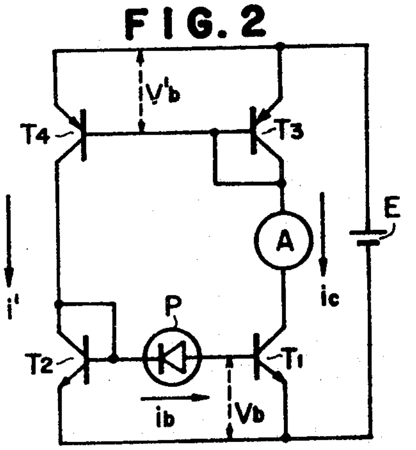
FIG. 2 is a circuit diagram of the first embodiment of the present invention.

FIG. 2 is one embodiment using transistors $T_2$ and $T_3$ as P-N junctions $L_2$ and $L_3$ shown in FIG. 1.

Transistors $T_1$, $T_3$ and $T_2$, $T_4$ are connected to power source E as shown and ammeter A is connected between the collectors of transistors $T_1$, $T_3$. The base and collector of transistor $T_3$ are connected together and transistor $T_4$ has the same characteristic as transistor $T_3$. The collector of transistor $T_4$ is connected to the negative side of photovoltaic cell P and the base and the collector of transistor $T_2$ are short-circuited. Transistor $T_2$ has the same characteristic as that of first transistor $T_1$.

Now if the generated current $i_b$ is produced by photovoltaic element P, the voltage $V_b$ is produced between the base and emitter of transistor $T_1$ and the collector current $i_c (= C_1 e^{rV_b})$ flowing through transistor $T_3$ and ammeter A is produced. By means of the above current $i_c$ the voltage $V_b$ is produced between the base and emitter of transistor $T_3$ and transistor $T_4$ is biased thereby. Thus, the current $i'$ $(= C_4 e^{rV_{b'}})$ flows into the collector of the transistor $T_4$, which current also flows through transistor $T_2$ between whose base and emitter the bias voltage $V_b''$ is produced. Accordingly, the following formula applies $$i' = C_2 e^{rV_{b''}}$$

Therefore, $$i_c = C_1 e^{rV_b} = C_3 e^{rV_{b'}}$$

$$i' = C_4 e^{rV_{b'}} = C_2 e^{rV_{b''}}$$

Thus, $$C_1 \cdot C_4 \cdot e^{rV_b} = C_3 \cdot C_2 \cdot e^{rV_{b''}}$$

If the condition of the present invention $$(C_4/C_3) \cdot (C_1/C_2) = 1$$

is substituted for the above $$V_b = V_{b''}$$

Accordingly, because the voltage across photovoltaic cell P is kept at zero voltage constantly, and because the generated current of photovoltanic cell P is proportional to the received light intensity thereof, and because the current $i_c$ amplified by transistor $T_1$ is proportional to the received light intensity of photovoltaic cell P, the photocell current can be detected by means of ammeter A.

In FIG. 2 diodes can be substituted for second transistor $T_2$ and transistor $T_3$.

The above mentioned are embodiments in which photovoltaic cell P is connected between the base of the first transistor and that of the second transistor, in which case the generated current of photovoltaic cell P proportional to the received light intensity of the cell is easily detected because the current is by means of first transistor $T_1$ and the amplified current amplified is detected by means of the ammeter A. However, the detection of the current proportional to the received light intensity of a photovoltaic cell of high precision is difficult, because the current is amplified by means of transistor $T_1$ which is influenced by the temperature variation of the current amplification factor, and, further, because the current amplification factor of the transistor is high or low in accordance with whether the input current is large or small.

Figure 3:
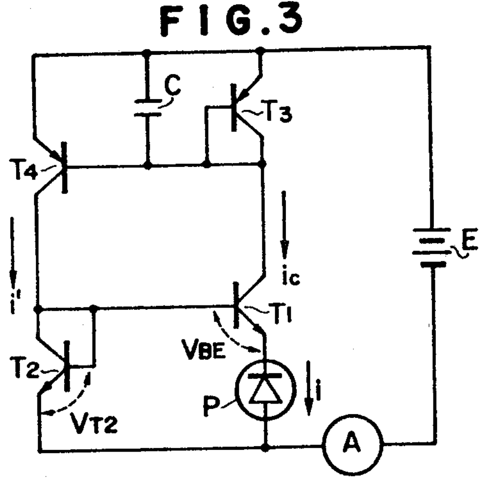
FIG. 3 is a circuit diagram of the second embodiment of the present invention.

The second embodiment of the present invention shown in FIG. 3 indicates the connection between the photovoltaic cell and the emitter of the first transistor, which is designed to detect the generated current proportional to the received light intensity of a photovoltaic cell of high precision so that the disadvantage referred to above is eliminated.

In this case, the collector, current $i_c$ of first transistor $T_1$ and the current $i'$ flowing through second transistor $T_2$ whose base and collector are short-circuited are proportionally related as referred to above. The feedback circuit is equipped with transistor $T_3$ whose base and collector are short-circuited and the other transistor $T_4$, as in the above-mentioned embodiment.

Further, if the relation of $$C_4/C_3 = C_2/C_1$$

is formed, which was mentioned previously, the voltage across photovoltaic cell P can be kept at zero voltage.

That is, in this embodiment photovoltaic cell P is connected to the emitter of first transistor $T_1$ and also via ammeter A to the negative side of power source E. The above first transistor $T_1$ is biased at voltage $V_{T2}$ by transistor $T_2$ which is the P-N junction whose base and collector are shortcircuited. And the collector of first transistor $T_1$ is connected to one end of transistor $T_3$ whose base and collector are short-circuited, and the emitter of transistor $T_3$ is connected to the positive side of the power source E. The voltage between the base and emitter of transistor $T_3$ is connected between the base and emitter of transistor $T_4$ whose collector is connected to the collector (base) of transistor $T_2$, and the emitter of said transistors $T_2$ is connected via ammeter A to the power source E.

If the voltage across photovoltaic cell P is $(-V_p)$, $$V_{T2} = V_{BE} + (-V_p)$$

However, $V_{BE}$ is the voltage between the base and emitter of transistor $T_1$.

The generated current $i$ at a time when photovoltaic cell P is charged with the voltage $V_P$ is $$i = i_l - i_0 \left\{ 1 - e^{\frac{q(-V_p)}{KT}} \right\}$$

and the above generated current i flows between the collector and emitter of transistor $T_1$, thus:

$$i = i_c$$

As illustrated in the embodiment of FIG. 2

$$i_c = C_1 \cdot e^{rV_{BE}} = C_3 \cdot e^{rV'}$$

$$i' = C_4 \cdot e^{rV'} = C_2 \cdot e^{rV_{T2}}$$

Therefore, $C_1 \cdot C_4 \cdot e^{rV_{BE}} = C_2 \cdot C \cdot e^{rV_{T2}}$

Thus, according to the present invention, the following relationship is achieved:

$$V_{BE} = V_{T2}$$

The voltage across photovoltaic cell P is 0, thus:

$$i = i_c = i_l$$

$i_c$ becomes equal to the current $i_l$ which is proportional to the received light intensity. Thus, the current $i_A$ flowing into the ammeter A is:

$$i_A = i_c + i'$$

Hence:

$$i' \infty i_c$$

Thus, $i_A$ becomes the current proportional to the received light intensity.

In this case, as in the first embodiment referred to above, by equalizing the current i', in accordance with the relation $$\beta''/\beta' = i'/i_c = C_2/C_1$$

between the amplification factor $\beta'$ of transistor $T_3$ and the amplification factor $\beta''$ of transistor $T_4$, to the current $i_c$, the above formula can be satisfied, and the voltage across photovoltaic cell P can be kept at zero voltage, and the generated current proportional to the received light can be detected.

Further, in FIG. 3 the condenser C, whose circuit is a feedback circuit, prevents oscillations produced because of the phase reversal, and its operation smooths the oscillating wave form.

I claim:

1. A light detecting circuit comprising:

means for generating current in response to light incident thereon;

a transistor having a base emitter junction connected to one terminal of said means for generating current;

biasing means including a P-N junction connected between said base emitter junction to oppose the voltage drop thereof and connected to the other terminal of said means for generating current; and feedback means connected between the collector of said transistor and said biasing means for providing said biasing means with an electric current proportional to the collector current of said transistor.

2. A light measuring circuit comprising:

means for generating current in response to light incident thereon;

a first transistor;

a first biasing means including a P-N junction connected between the base and the emitter of said first transistor through said means for generating current;

a second transistor having a collector connected to said first biasing means;

a second biasing means including a P-N junction connected between the vase and the emitter of said second transistor and connected to the collector of said first transistor so that the collector current thereof flows through the P-N junction of said second biasing means;

an ammeter connected to the output of said first transistor; and said first and second transistors and said P-N junction are selected in accordance with the following:

$$C_2/C_1 = C_4/C_3$$

wherein $C_1$, $C_2$, $C_3$, $C_4$ are respective constants for the base-emitter junction of said first transistor, the P-N junction of said first biasing means, the base-emitter junction of said second transistor and the P-N junction of said second biasing means, and $$i = C_n \cdot e^{rV} \ (n = 1, 2, 3 \text{ or } 4)$$

3. A light measuring circuit as set forth in claim 2, wherein said means for generating current is connected between the base of said first transistor and said first biasing means.

4. A light measuring circuit as set forth in claim 3, wherein said ammeter is connected between the collector of said first transistor and said second biasing means.

5. A light measuring circuit as set forth in claim 2, wherein said first biasing means is a third transistor having an interconnected base and a collector and connected to the base of said first transistor and the collector of said second transistor, and an emitter connected to the emitter of said first transistor.

6. A light measuring circuit as set forth in claim 5, wherein said second biasing means is a fourth transistor having an interconnected base and a collector and connected to the base of said second transistor, and a emitter connected to the emitter of said second transistor.

7. A light measuring circuit as set forth in claim 2, wherein said means for generating current is connected to the emitter of said first transistor.

8. A light measuring circuit as set forth in claim 7, wherein said means for generating current, said first transistor and said second biasing means are connected in series with each other, and a power source is connected across the series connection via said ammeter.

9. A light measuring circuit as set forth in claim 2, further comprising a capacitor shunted across the P-N junction of said second biasing means.

* * * * *